United States Patent
Zhang et al.

(10) Patent No.: US 8,288,829 B2
(45) Date of Patent: Oct. 16, 2012

(54) TRIPLE WELL TRANSMIT-RECEIVE SWITCH TRANSISTOR

(75) Inventors: Yue Ping Zhang, Singapore (SG); Qiang Li, Singapore (SG)

(73) Assignee: Nanyang Technological University, Singapore (SG)

( * ) Notice: Subject to any disclaimer, the term of this patent is extended or adjusted under 35 U.S.C. 154(b) by 643 days.

(21) Appl. No.: 12/442,519

(22) PCT Filed: Sep. 21, 2006

(86) PCT No.: PCT/SG2006/000278
§ 371 (c)(1),
(2), (4) Date: Mar. 23, 2009

(87) PCT Pub. No.: WO2008/036047
PCT Pub. Date: Mar. 27, 2008

(65) Prior Publication Data
US 2010/0001351 A1    Jan. 7, 2010

(51) Int. Cl.
*H01L 29/76* (2006.01)
(52) U.S. Cl. .......... 257/392; 257/343; 257/350
(58) Field of Classification Search .......... 257/343, 257/350, 392, 548, E27.061
See application file for complete search history.

(56) References Cited

U.S. PATENT DOCUMENTS

| | | | |
|---|---|---|---|
| 6,218,895 B1 | 4/2001 | De et al. | 327/566 |
| 6,307,233 B1 | 10/2001 | Awaka et al. | 257/368 |
| 6,635,934 B2 * | 10/2003 | Hidaka | 257/369 |
| 6,914,791 B1 | 7/2005 | Park et al. | 363/60 |
| 7,106,568 B2 | 9/2006 | Chen | 361/91.1 |
| 2003/0043640 A1 | 3/2003 | Marr et al. | 365/189.09 |
| 2006/0044714 A1* | 3/2006 | Chen | 361/56 |
| 2006/0091957 A1 | 5/2006 | Darabi et al. | 330/285 |

OTHER PUBLICATIONS

Aparicio et al., "Capacity Limits and matching properties of integrated capacitors," IEEE Journal of Solid State circuits, vol. 37, No. 3, Mar. 2002.
Asai et al., "Analog MOS circuit systems performing the visual tracking with bio-inspired simple networks," Toyohashi University of Technology, Department of Electrical and Electronic Engineering, 7 pages.
Huang et al., "A 0.5-µm CMOS T/R Switch for 900-MHz Wireless Applications," IEEE Journal of Solid-State Circuits, vol. 36, No. 3, pp. 486-492, Mar. 2001.
Li et al., "5.8-GHz CMOS T/R Switches with High and Low Substrate Resistances in a 0.18-µm CMOS Process," IEEE Microwave and Wireless Components Letters, vol. 13, No. 1, pp. 1-3, Jan. 2003.
Li et al., "15-GHz Fully Integrated nMOS Switches in a 0.13-µm CMOS Process," IEEE Journal of Solid state circuits, vol. 40, No. 11, Nov. 2005.

(Continued)

*Primary Examiner* — Hung Vu
(74) *Attorney, Agent, or Firm* — Robert Iannucci; Seed IP Law Group PLLC

(57) ABSTRACT

A transistor arrangement including a triple well structure, the triple well structure including a substrate of a first conductivity type, a first well region of a second conductivity type formed within the substrate and a second well region of the first conductivity type being separated from the substrate by the first well region. The transistor arrangement further includes a first transistor formed on or in the second well region, the first transistor including a body terminal being connected to the second well region and a second well region switch being connected to the body terminal of the first transistor.

22 Claims, 13 Drawing Sheets

OTHER PUBLICATIONS

Ohnakado et al., "21.5-dBm Power-Handling 5-GHz Transmit/Receive CMOS Switch Realized by Voltage Division Effect of Stacked Transistor Configuration with Depletion-Layer-Extended Transistors (DETs)," IEEE Journal of Solid-State Circuits, vol. 39, No. 4, pp. 577-584, Apr. 2004.

Talwalkar et al., "Integrated CMOS Transmit-Receive Switch Using LC-Tuned Substrate Bias for 2.4-GHz and 5.2-GHz Applications," IEEE Journal of Solid State Circuits, vol. 39, No. 6, pp. 863-870, Jun. 2004.

Tinella et al., "A High-performance CMOS-SOI Antenna Switch for the 2.5-5-GHz Band," IEEE Journal of Solid-State Circuits, vol. 38, No. 7, pp. 1279-1283, Jul. 2003.

Yamamoto et al., "A 2.4-GHz-Band 1.8-V Operation Single-Chip Si-CMOS T/R-MMIC Front-End with a Low Insertion Loss Switch," IEEE Journal of Solid state circuits, vol. 36, No. 8, Aug. 2001.

Yeh et al., "Design and Analysis for a Miniature CMOS SPDT Switch Using Body-Floating Technique to improve Power Performance," IEEE Transactions on Microwave Theory and Techniques, vol. 54, No. 1, pp. 31-39, Jan. 2006.

Yue et al., "A study on substrate effects of silicon-based RF passive components," Center for Integrated Systems, IEEE MTT-S Digest, pp. 1625-1628, 1999.

Zhang et al., "A Differential CMOS T/R Switch for Multistandard Applications," IEEE Transactions on Circuits and Systems-II: Express Briefs, vol. 53, No. 8, pp. 782-786, Aug. 2006.

* cited by examiner

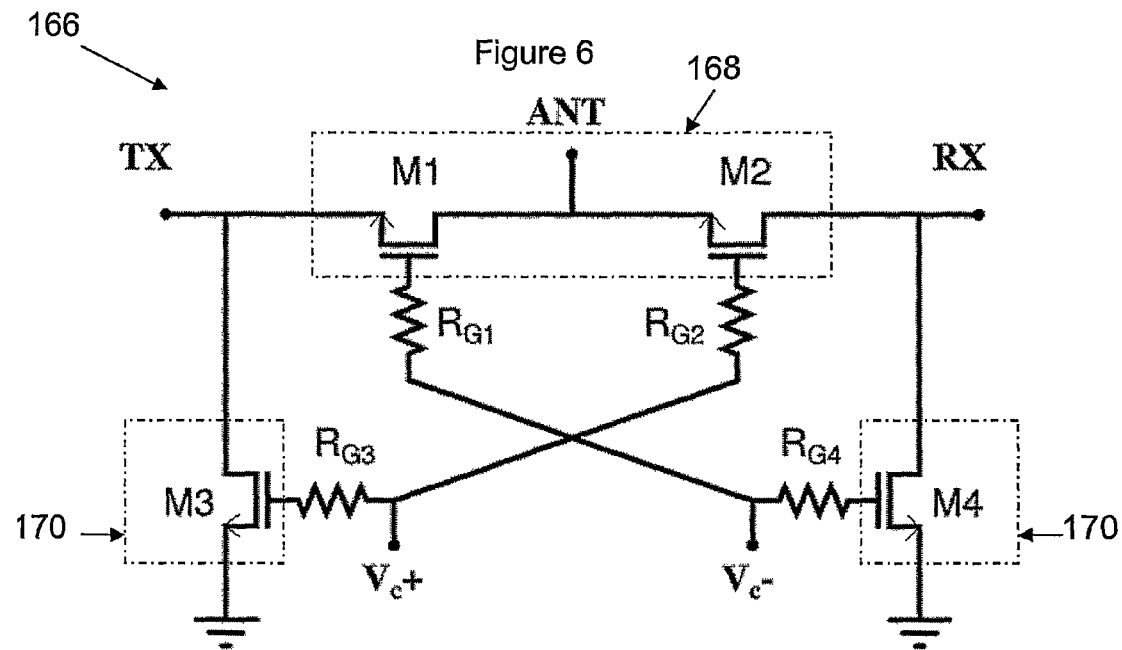

Figure 9A
Figure 9B
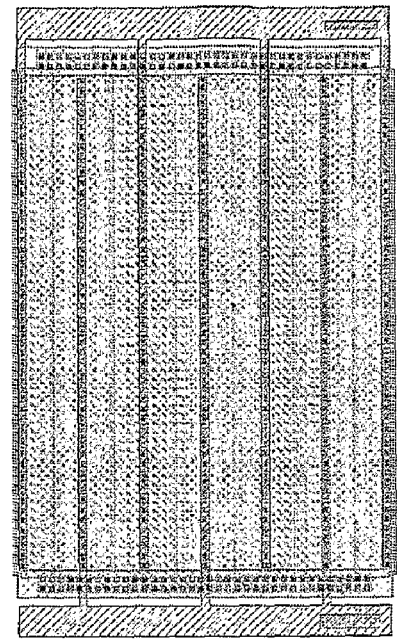
Figure 9C
| Parasitic Capacitances | Foundry Layout (Fig.4(a)) | Customized Layout (Fig.4(b)) |
|---|---|---|
| $C_{gs}$ (fF) | 19 | 19 |
| $C_{gd}$ (fF) | 19 | 19 |
| $C_{gb}$ (fF) | 3.7 | 7.1 |
| $C_{sb}$ (fF) | 9.3 | 37 |
| $C_{db}$ (fF) | 8.3 | 33 |
| $C_{ds}$ (fF) | 36 | 0 |

TRIPLE WELL TRANSMIT-RECEIVE SWITCH TRANSISTOR

FIELD OF THE INVENTION

The present invention relates to the field of transmit-receive (T/R) switches, and in particular, to a T/R switch design with low insertion loss, high isolation, high linearity and high power handling capability.

BACKGROUND OF THE INVENTION

With the development of modern silicon technology, more and more high-frequency circuits can be implemented in standard CMOS process. Radio-frequency (RF) integrated circuits (IC) in standard CMOS technology have proven feasible. However, further integration of T/R antenna switches in CMOS is quite challenging due to the higher loss of silicon substrate and lower linearity of CMOS devices.

For years RF switch has been dominated by discrete components using p-type, intrinsic, n-type (PIN) diodes and III-V metal-semiconductor field-effect transistors (MESFETs). Recently, CMOS T/R switch design has been explored to a certain extent. In relation to insertion loss, publication "A 0.5-μm CMOS T/R Switch for 900-MHz Wireless Applications", Huang F. J. et al, IEEE Journal of Solid-State Circuits, Vol. 36 No. 3, pp. 486-492, March 2001 and publication "5.8-GHz CMOS T/R Switches With High and Low Substrate Resistances in a 0.18-μm CMOS Process", Li Z. B. et al, IEEE Microwave and Wireless Components Letters, Vol. 13, No. 1, pp. 1-3, January 2003 reported that low insertion loss can be achieved by optimizing the transistor widths and bias voltages, by minimizing the substrate resistances, and by dc biasing the transmit and receive nodes, which decreases the capacitances while increasing the power 1-dB compression point.

In relation to isolation, publication "A High-performance CMOS-SOI Antenna Switch for the 2.5-5-GHz', Carlo Tinella et al, IEEE Journal of Solid-State Circuits, Vol. 38, No. 7, pp. 1279-1283, July 2003 reported that a high isolation can be achieved by taking advantage of the high resistive substrate and underlying oxide of silicon-on-insulator (SOI) technology. However, in these respective publications, linearity was limited due to parasitic capacitance and source-drain junction diodes. Thus various techniques are developed to achieve higher linearity.

One technique to increase linearity is the body floating technique. Publication "Integrated CMOS Transmit-Receive Switch Using LC_tuned Substrate Bias for 2.4-GHz and 5.2-GHz Applications", Niranjan A. Talwalkar et al, IEEE Journal of Solid-State Circuits, Vol. 39, No. 6, pp. 863-870, June 2004 introduced a body floating technique involving an inductive substrate bias scheme. The bias scheme uses an inductor-capacitor (L/C) tank to enhance the linearity of the metal oxide semiconductor field-effect transistor (MOSFET) when used as a pass gate at RF. However, this technique has the disadvantages of design complexity and consumption of large silicon area.

Taking advantage of triple-well CMOS process, another body floating technique can be realized using a large resistor to bias the body or bulk as reported in publication "Design and Analysis for a Miniature CMOS SPDT Switch Using Body-Floating Technique to improve Power Performance", Yeh M. C et al, IEEE Transactions on Microwave Theory and Techniques", Vol. 54, No. 1, pp. 31-39, January 2006. As resistors are intrinsically wideband, the linearity improvement of this technique is also wideband.

Another technique to improve linearity involves the use of stacked transistors. Publication "21.5-dBm Power-Handling 5-GHz Transmit/Receive CMOS Switch Realized by Voltage Division Effect of Stacked Transistor Configuration With Depletion-Layer-Extended Transistors (DETs), Takahiro Ohnakado et al, IEEE Journal of Solid-State Circuits, Vol. 39, No. 4, pp. 577-584, April 2004 reported a T/R CMOS switch utilizing the depletion-layer-extended transistor (DET), which possesses high effective substrate resistance and enables the voltage division effect of the stacked transistor configuration to work in the CMOS switch. Although linearity is improved, insertion loss will be degraded and has to be compensated by the DET.

Yet another technique to improve linearity involves integration of on-chip LC impedance transformation networks (ITNs) into a switch. Publication "15-GHz Fully Integrated nMOS Switches in a 0.13-μm CMOS Process" reported two fully integrated nMOS switches which have been demonstrated at 15 GHz in a 0.13-m CMOS foundry process. One switch incorporates on-chip LC ITNs while the second switch does not. The switches with and without ITNs achieve the same 1.8-dB insertion loss at 15 GHz, but 21.5 and 15 dBm input $P_{1dB}$, respectively. The degradation of insertion loss due to use of ITNs is compensated by reducing the mismatch loss caused by the bond pad parasitics. The switch without ITNs is suitable for 3.1-10.6 GHz ultra-wide-band (UWB) applications. The switch with ITNs has 5 dB worse isolation than the switch without. The difference is due to the larger transistor size of the switch with ITNs, which introduces lower parasitic impedance path between Tx/Rx ports and antenna port. In this publication, although linearity is improved, isolation performance is degraded.

Yet another technique to improve linearity involves the use of differential architectures. Publication "A Differential CMOS T/R Switch for Multistandard Applications", Zhang Y. P. et al, IEEE Transactions on Circuits and Systems-II: Express Briefs, Vol. 53, No. 8, pp. 782-786, August 2006 presented a differential T/R switch integrated in a 0.18-m standard CMOS technology for wireless applications up to 6 GHz. This switch design employs a fully differential architecture to accommodate the design challenge of differential transceivers and improve the linearity performance. It exhibits less than 2-dB insertion loss, higher than 15-dB isolation, in a 60 m×40 m area. 15-dBm power at 1-dB compression point (1 dB) is achieved without using additional techniques to enhance the linearity. This switch is suitable for differential transceiver front-ends with a moderate power level.

Comparing to other RF IC circuits that have been pushed up to 60-GHz, the current design of CMOS T/R switches for higher frequency operations are explored only to a limited extent. Most of these switches adopt series-shunt architecture. At higher frequencies, the loss due to the shunt arm will severely degrades the insertion loss, while the lack of shunt arm will result in low isolation. Therefore, an objective of the present invention is to provide an alternative T/R switch design with low insertion loss, high isolation, high linearity and high power handling capability thereby advantageously avoids or reduces some of the above-mentioned drawbacks of prior art devices.

SUMMARY OF THE INVENTION

In one embodiment of the invention, a transistor arrangement is provided including a triple well structure, the triple well structure including a substrate of a first conductivity type, a first well region of a second conductivity type formed within the substrate and a second well region of the first conductivity type being separated from the substrate by the first well region. The transistor arrangement further includes a first transistor formed on or in the second well region, the first transistor including a body terminal being connected to the second well region and a second well region switch being connected to the body terminal of the first transistor.

In one embodiment of the invention, a controller may be connected to a control terminal of the second well region switch and control the second well region switch to be opened when the first transistor is in the ON state and to be closed when the first transistor is in the OFF state. The controller may be an input source supplying a drive voltage to the gate terminal in the case of a MOSFET transistor or to the base terminal in the case of a BJT transistor. The drive voltage or voltage applied between gate and source (or between base and emitter of a BJT) to switch the MOSFET ON must exceed a threshold value $V_T$. Reducing the drive voltage to below $V_T$ will cause the MOSFET to turn OFF.

In another embodiment of the invention, the substrate may be a P-type substrate, the first well region may be an N-type well region and the second well region may be a P-type well region for an NMOS transistor. For a PMOS transistor, the substrate may be an N-type substrate, the first well region may be a P-type well region and the second well region may be an N-type well region.

In a further embodiment of the invention, the first transistor further includes a source terminal, a gate terminal and a drain terminal in addition to a body terminal. The source terminal includes a source diffusion region of the second conductivity type being formed in the second well region and the drain terminal including a drain diffusion region of the second conductivity type being formed in the second well region. The body terminal includes a body diffusion region of the first conductivity type being formed in the second well region. The source terminal and the drain terminal include a diffusion region of a different conductivity from the body terminal. The source terminal, the drain terminal and the body terminal include diffusion regions formed in the second well region.

In another embodiment of the invention, the second well region switch may be a transistor. The transistor may be a field-effect transistor or a bipolar transistor. The transistor may be selected from a group of transistors consisting of metal-oxide-semiconductor field-effect transistor, n-channel metal-oxide-semiconductor field-effect transistor, p-channel metal-oxide-semiconductor field-effect transistor, junction gate field-effect transistor, insulated gate bipolar transistor but not so limited.

In another embodiment of the invention, a first well region terminal may be connected to the first well region. The first well region terminal connected to the first well region may include a diffusion region of the second conductivity type being formed in the first well region.

In another embodiment of the invention, a passive component may be coupled to the first well region terminal. The passive component may include a component selected from the group consisting of resistor, inductor and capacitor. Alternatively, a first well region switch may be coupled to the first well region terminal. The first well region switch may be a transistor. The transistor may be a field-effect transistor or a bipolar transistor. The transistor may be selected from a group of transistors consisting of metal-oxide-semiconductor field-effect transistor, n-channel metal-oxide-semiconductor field-effect transistor, p-channel metal-oxide-semiconductor field-effect transistor, junction gate field-effect transistor, insulated gate bipolar transistor but not so limited.

In another embodiment of the invention, the transistor arrangement may have a single-ended architecture or a differential architecture.

In another embodiment of the invention, the transistor arrangement may include a second transistor having a source terminal, a gate terminal and a drain terminal. The gate terminal of the first transistor and the gate terminal of the second transistor may be arranged at a distance from one another of at least about twice the maximum process technology resolution.

In one embodiment of the invention, a transistor arrangement is provided including a triple well structure, the triple well structure including a substrate of a first conductivity type, a first well region of a second conductivity type formed within the substrate and a second well region of the first conductivity type being separated from the substrate by the first well region. The transistor arrangement further includes a first transistor formed on or in the second well region and the first transistor including a body terminal being connected to the second well region. The transistor arrangement also includes a first passive component being connected to the body terminal of the first transistor, a first well region terminal connected to the first well region and a second passive component being coupled to the first well region terminal.

In one embodiment of the invention, a transistor arrangement is provided including a triple well structure, the triple well structure including a substrate of a first conductivity type, a first well region of a second conductivity type formed within the substrate and a second well region of the first conductivity type being separated from the substrate by the first well region. The transistor arrangement further includes a first transistor formed on or in the second well region and the first transistor including a body terminal being connected to the second well region. The transistor arrangement also includes a second well region switch being connected to the body terminal of the first transistor, a first well region terminal connected to the first well region and a first passive component being coupled to the first well region terminal.

The following figures illustrate various exemplary embodiments of the present invention. However, it should be noted that the present invention is not limited to the exemplary embodiments illustrated in the following figures.

BRIEF DESCRIPTION OF THE DRAWINGS

FIG. 6 shows a schematic of a conventional series-shunt type single-ended T/R switch arrangement;

FIG. 7 shows a model of parasitic capacitances of a MOS transistor that is used as a switch when the transistor is in the cut-off region;

FIG. 9A shows a foundry p-cell layout of an NMOS transistor operating as a switch;

FIG. 9B shows a customized layout of an NMOS transistor operating as a switch according to an embodiment of the present invention;

FIG. 9C shows a comparison table of parasitic capacitances of an NMOS transistor in cutoff region based on a p-cell foundry layout and a customized layout according to an embodiment of the present invention;

DETAILED DESCRIPTION OF THE INVENTION

Exemplary embodiments of a switch transistor arrangement are described in details below with reference to the accompanying figures. In addition, the exemplary embodiments described below can be modified in various aspects without changing the essence of the invention.

Figure 1A:
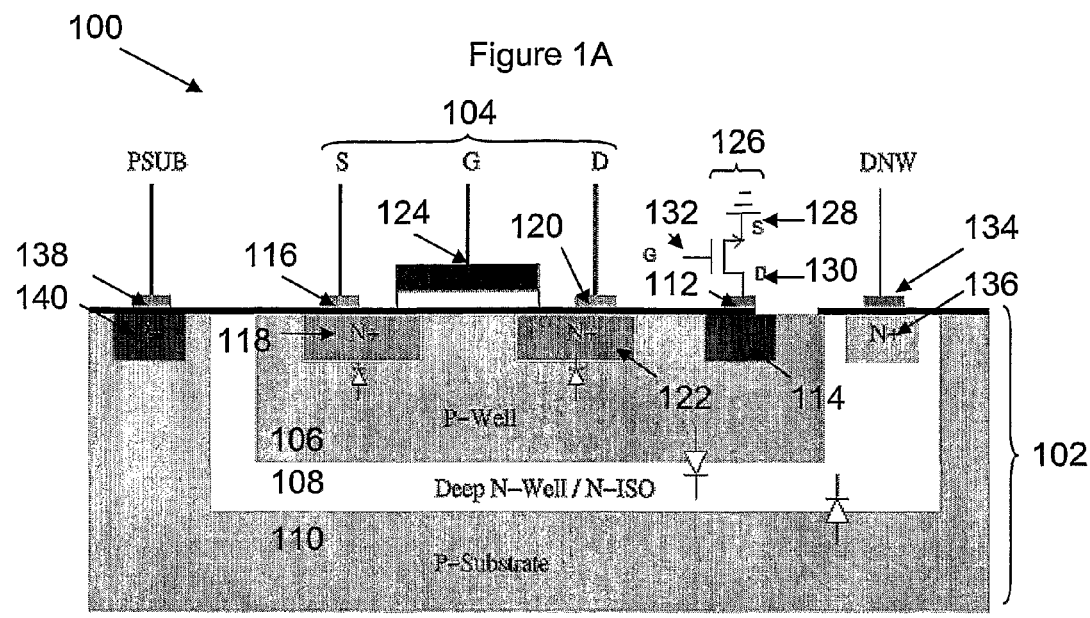
FIG. 1A shows a cross-sectional view of a transistor arrangement including a first NMOS transistor in a triple-well structure with the body terminal being biased by a second NMOS transistor according to an embodiment of the present invention.

FIG. 1A shows a cross-sectional view of a transistor arrangement or a T/R switch arrangement including a first NMOS transistor in a triple-well structure with the body terminal being biased by a second NMOS transistor according to an embodiment of the present invention. The transistor arrangement 100 includes a triple well structure 102 and a first NMOS transistor 104 formed on or in a P-type well 106 of the triple well structure 102. The triple well structure 102 includes the P-type well 106, an N-type well 108 and a P-type substrate 110. The P-type well 106 and the N-type well 108 are located inside the P-type substrate 110 and the N-type well 108 isolates the P-type well 106 from the P-type substrate 110. The P-type substrate 110 is typically P-type silicon, for example having a resistivity range of about 10 ohm-cm to about 25 ohm-cm. The P-type well 106 or P-well has a typical well depth of, for example, about 2 μm to about 4 μm with an average doping concentration, for example, in the range of about $1\times10^{16}$ atoms per cubic centimeter to about $5\times10^{16}$ atoms per cubic centimeter. The N-type well 108 or N-well has a typical well depth of, for example, about 4 μm to about 8 μm. The doping concentration may be from about $4\times10^{15}$ atoms per cubic centimeter to about $1\times10^{16}$ atoms per cubic centimeter. The triple well structure 102 is formed by the P-type well 106 counter doping the N-type well 108. The formation of the elements in the triple well structure 102 is as follows. An N-type well 108 implant is done, for example, with phosphorous ($P_{31}$) with a typical dose of about 1.0 atoms per square centimeter to about 1.5×1013 atoms per square centimeter and energies from about 160 Kev to about 100 Kev. The N-type well 108 implant is driven using a high temperature step which may typically be about 6 to about 12 hours at about 1125° C. to about 1150° C. The N-type well 108 is then counter doped with a P-type well 106 implant. Typical dosages for the P-type well 106 implant could be about 1.5 atoms per square centimeter to about 2.5×1013 atoms per square centimeter with energies of about 30 Kev to about 180 Kev using a species such as boron ($B_{11}$). The N-type well 108 and P-type well 106 are then driven, typically about 6 hours to about 10 hours at about 1125° C. to about 1150° C. This sets the respective P-type 106 and N-type 108 wells to the desired doping concentrations and depths.

The first NMOS transistor 104 includes a body terminal 112 having a P-type body diffusion region 114, a source terminal 116 having an N-type source diffusion region 118, a drain terminal 120 having an N-type drain diffusion region 122 and a gate terminal 124. The P-type body diffusion region 114, the N-type source diffusion region 118 and the N-type drain diffusion region 122 are all formed in the P-type well 106. The transistor arrangement 100 further includes a second NMOS transistor 126 which acts as a switch and is connected to the body terminal 112 of the first NMOS transistor 104 so as to bias the first NMOS transistor 104 such that the body terminal 112 of the first NMOS transistor 104 is floating only when the first NMOS transistor 104 is in the ON state. The body terminal 112 of the first NMOS transistor 104 is not floating when the first NMOS transistor 104 is in the OFF state. By turning on the body floating only when the first NMOS transistor 104 is in the ON state may further improve the isolation performance of the transistor arrangement. The second NMOS transistor 126 includes a body terminal (not shown), a source terminal 128, a drain terminal 130 and a gate terminal 132. The drain terminal 130 of the second NMOS transistor 126 is connected to the body terminal 112 of the first NMOS transistor 104 and the source terminal 128 of the second NMOS transistor 126 is connected to ground. To turn the second NMOS transistor 126ON, a voltage is applied to the gate terminal 132 of the second NMOS transistor 126 such that the gate-source voltage is above the threshold voltage of the transistor. The second NMOS transistor 126 will be OFF if the gate-source voltage drops below the threshold voltage of the transistor. The transistor arrangement 100 further includes an N-well terminal 134 connected to the N-type well 108. The N-well terminal 134 includes an N-type diffusion region 136 formed in the N-type well 108. The transistor arrangement 100 also includes a P-substrate terminal 138 connected to the P-type substrate 110. The P-substrate terminal 138 includes a P-type diffusion region 140 formed in the P-type substrate 110.

Figure 1B:
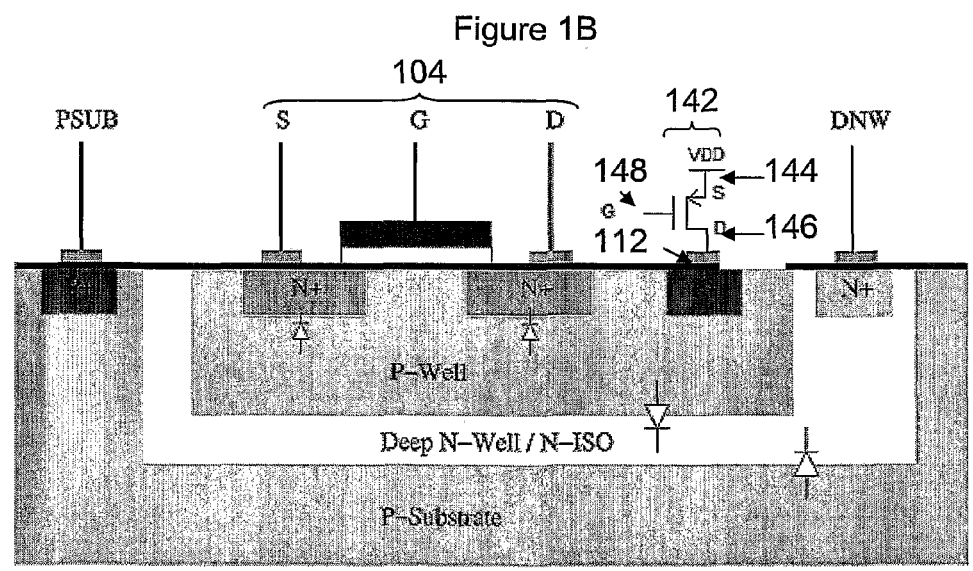
FIG. 1B shows a cross-sectional view of a transistor arrangement including an NMOS transistor in a triple-well structure with the body terminal being biased by a PMOS transistor according to an embodiment of the present invention.

The body terminal of the first NMOS transistor can also be biased by a PMOS transistor. FIG. 1B shows a cross-sectional view of a transistor arrangement including an NMOS transistor in a triple-well structure with the body terminal being biased by a PMOS transistor according to an embodiment of the present invention. Features already described with respect to FIG. 1A will not be described again here. Nevertheless, same reference signs refer to identical components. The PMOS transistor 142 includes a body terminal (not shown), a source terminal 144, a drain terminal 146 and a gate terminal 148. The drain terminal 146 of the PMOS transistor 142 is connected to the body terminal 112 of the NMOS transistor 104 and the source terminal 144 of the PMOS transistor 142 is connected to a power supply $V_{DD}$. To turn the PMOS transistor 142ON, a voltage is applied to the gate terminal 148 of the PMOS transistor 142 such that the gate-source voltage is below the threshold voltage of the transistor. The PMOS transistor 142 will be OFF if the gate-source voltage increases above the threshold voltage of the transistor.

Figure 2:
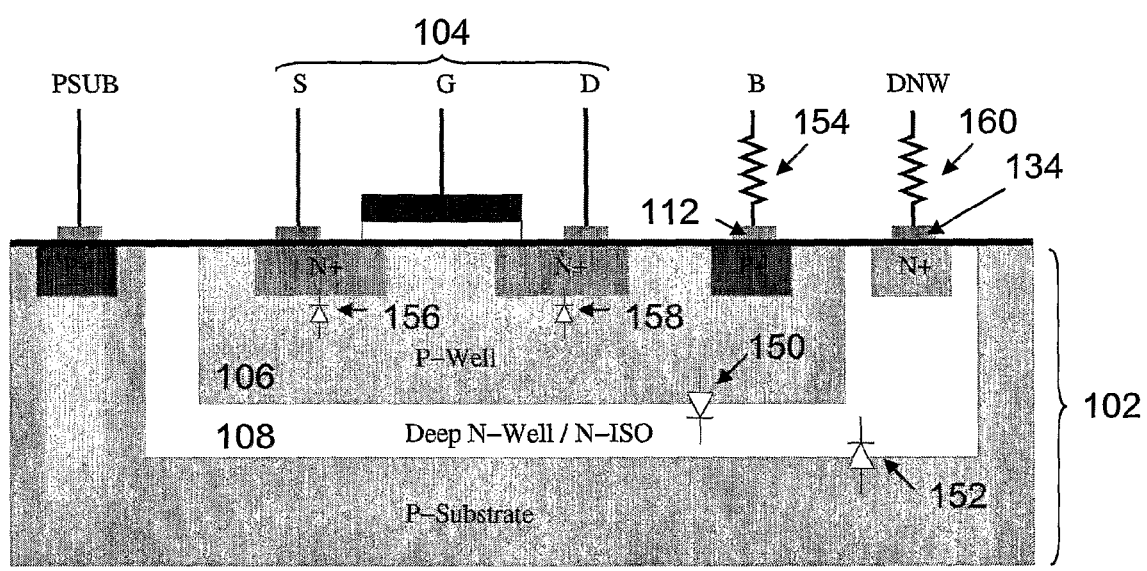
FIG. 2 shows a cross-sectional view of a transistor arrangement including an NMOS transistor in a triple-well structure with the body terminal being biased by a first resistor and the N-well terminal being biased by a second resistor according to an embodiment of the present invention.

FIG. 2 shows a cross-sectional view of a transistor arrangement including an NMOS transistor in a triple-well structure with the body terminal being biased by a first resistor and the N-well terminal being biased by a second resistor according to an embodiment of the present invention. The presence of an N-type well 108 in the triple well structure 102 creates two more diodes, namely the diode 150 between the P-type well 106 and the N-type well 108 and the diode 152 between the N-type well 108 and the P-type substrate 110. The body terminal 112 of the NMOS transistor 104 is biased by a large resistor 154 thereby the body terminal 112 becomes RF floating. When the body terminal 112 of the NMOS transistor 104 is floated by a large resistor 154, the transient voltage of the P-type well 106 is actually bootstrapped by the signal voltage. This prevents the source-bulk diode 156 and drain-bulk diode 158 from being turned on by large signals and thereby improve the linearity performance of the transistor arrangement. However, the diode 150 between the P-type well 106 and the N-type well 108 becomes unprotected and can be turned on by large P-type well 106 voltages. Once the turn-on happens, the RF-floating state of the body terminal 112 in the P-type well 106 is broken and the linearity performance may be degraded immediately. To overcome the body-floating limitation, a double-well body-floating technique is introduced where both the P-type well 106 and the N-type well 108 are biased by large resistors 154, 160. With both the body terminal 112 of the P-type well 106 and the N-well terminal 134 of the N-type well 108 floated, the diode 150 between the P-type well 106 and the N-type well 108 and the diode 152 between the N-type well 108 and P-type substrate 110 will not be turned on and linearity performance of the transistor arrangement will not be degraded.

Figure 3A:
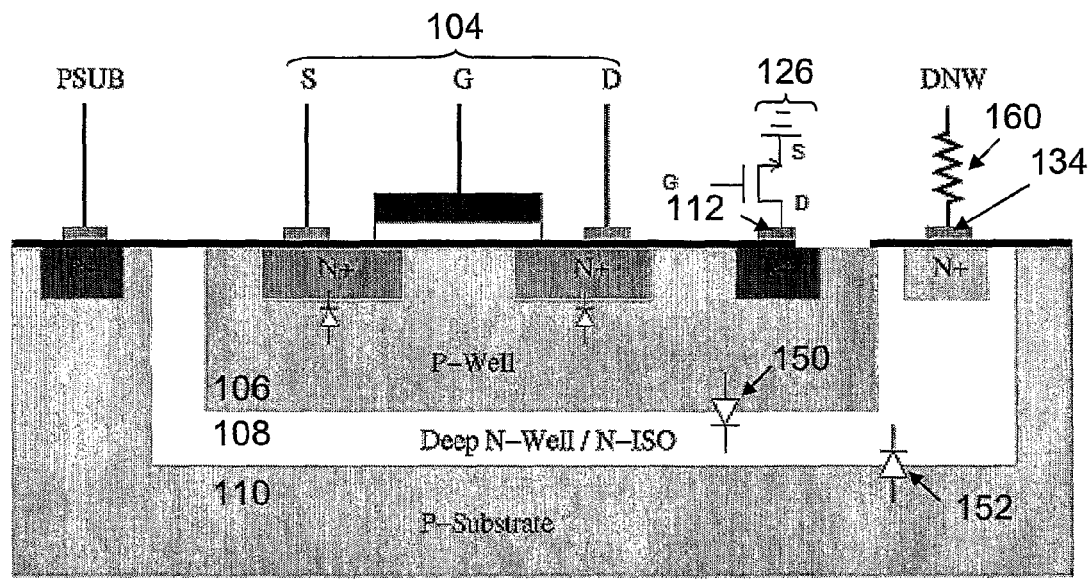
FIG. 3A shows a cross-sectional view of a transistor arrangement including a first NMOS transistor in a triple-well structure with the body terminal being biased by a second NMOS transistor and the N-well terminal being biased by a resistor according to an embodiment of the present invention.

FIG. 3A shows a cross-sectional view of a transistor arrangement including a first NMOS transistor in triple-well technology with the body terminal being biased by a second NMOS transistor and the N-well terminal being biased by a resistor according to an embodiment of the present invention. FIG. 3A is similar to FIG. 1A except that the N-well terminal 134 has been biased by a resistor 160 as shown in FIG. 3A. Biasing the body terminal 112 of the first NMOS transistor 104 with a second NMOS transistor 126 enables body-floating condition only when the first NMOS transistor 104 is ON, thereby improving the isolation performance while biasing the N-well terminal 134 with a resistor 160 may help to overcome the body-floating limitation due to the diode 150 between the P-type well 106 and the N-type well 108 and the diode 152 between the N-type well 108 and P-type substrate 110.

Figure 3B:
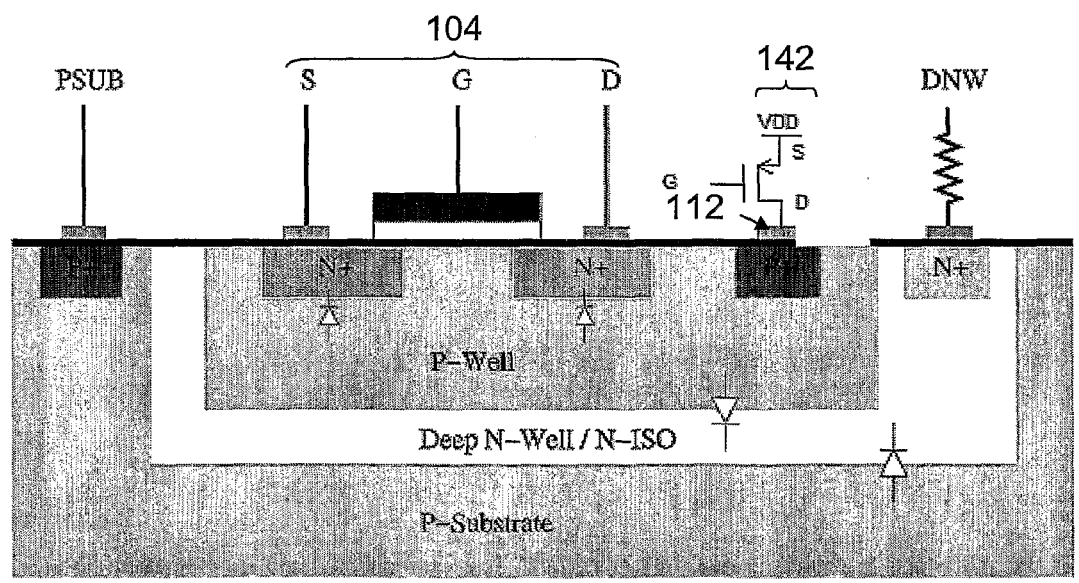
FIG. 3B shows a cross-sectional view of a transistor arrangement including an NMOS transistor in a triple-well structure with the body terminal being biased by a PMOS transistor and the N-well terminal being biased by a resistor according to an embodiment of the present invention.

FIG. 3B shows a cross-sectional view of a transistor arrangement including an NMOS transistor in a triple-well structure with the body terminal being biased by a PMOS transistor and the N-well terminal being biased by a resistor according to an embodiment of the present invention. FIG. 3B is similar to FIG. 3A with the difference such that the body terminal 112 of the NMOS transistor 104 is biased by a PMOS transistor 142 instead of an NMOS transistor.

Figure 4A:
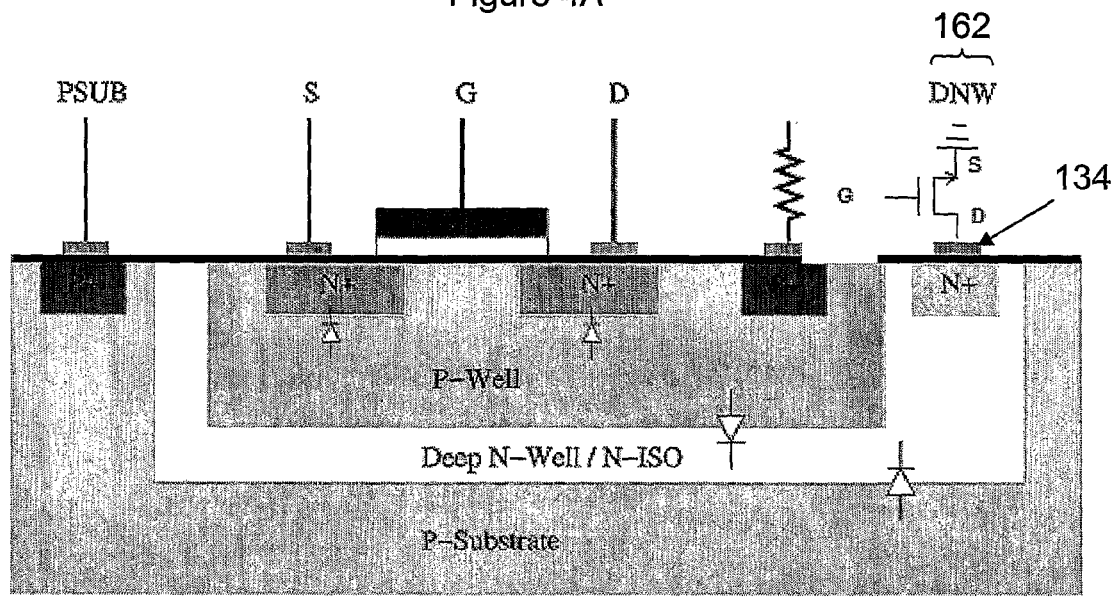
FIG. 4A shows a cross-sectional view of a transistor arrangement including a first NMOS transistor in a triple-well structure with the body terminal being biased by a resistor and the N-well terminal being biased by a second NMOS transistor according to an embodiment of the present invention.

FIG. 4A shows a cross-sectional view of a transistor arrangement including a first NMOS transistor in a triple-well structure with the body terminal being biased by a resistor and the N-well terminal being biased by a second NMOS transistor according to an embodiment of the present invention. FIG. 4A is similar to FIG. 2 except that the N-well terminal 134 has been biased by a NMOS transistor 162 as shown in FIG. 4A instead of a resistor.

Figure 4B:
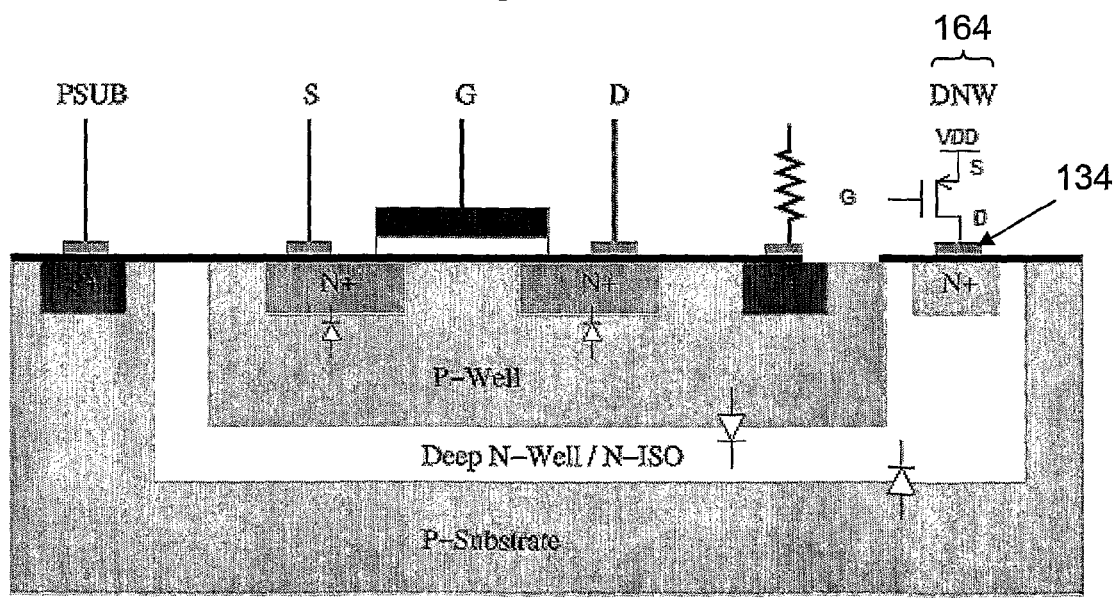
FIG. 4B shows a cross-sectional view of a transistor arrangement including an NMOS transistor in a triple-well structure with the body terminal being biased by a resistor and the N-well terminal being biased by a PMOS transistor according to an embodiment of the present invention.

FIG. 4B shows a cross-sectional view of a transistor arrangement including an NMOS transistor in a triple-well structure with the body terminal being biased by a resistor and the N-well terminal being biased by a PMOS transistor according to an embodiment of the present invention. FIG. 4B is similar to FIG. 4A with the difference such that the N-well terminal 134 is biased by a PMOS transistor 164 as shown in FIG. 4B instead of an NMOS transistor.

Figure 5A:
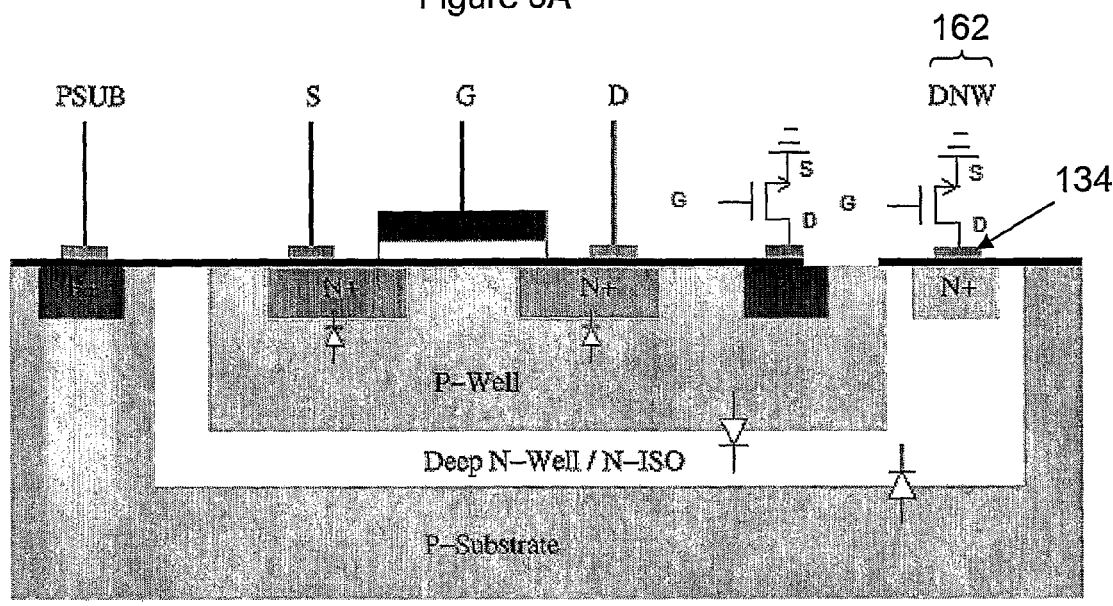
FIG. 5A shows a cross-sectional view of a transistor arrangement including a first NMOS transistor in a triple-well structure with the body terminal being biased by a second NMOS transistor and the N-well terminal being biased by a third NMOS transistor according to an embodiment of the present invention.

FIG. 5A shows a cross-sectional view of a transistor arrangement including a first NMOS transistor in a triple-well structure with the body terminal being biased by a second NMOS transistor and the N-well terminal being biased by a third NMOS transistor according to an embodiment of the present invention. FIG. 5A is similar to FIG. 3A with the difference such that the N-well terminal 134 is biased by an NMOS transistor 162 instead of a resistor. Biasing the N-well terminal 134 by an NMOS transistor 162 instead of a resistor allows the flexibility of synchronizing with the NMOS transistor which is connected to the body terminal.

Figure 5B:
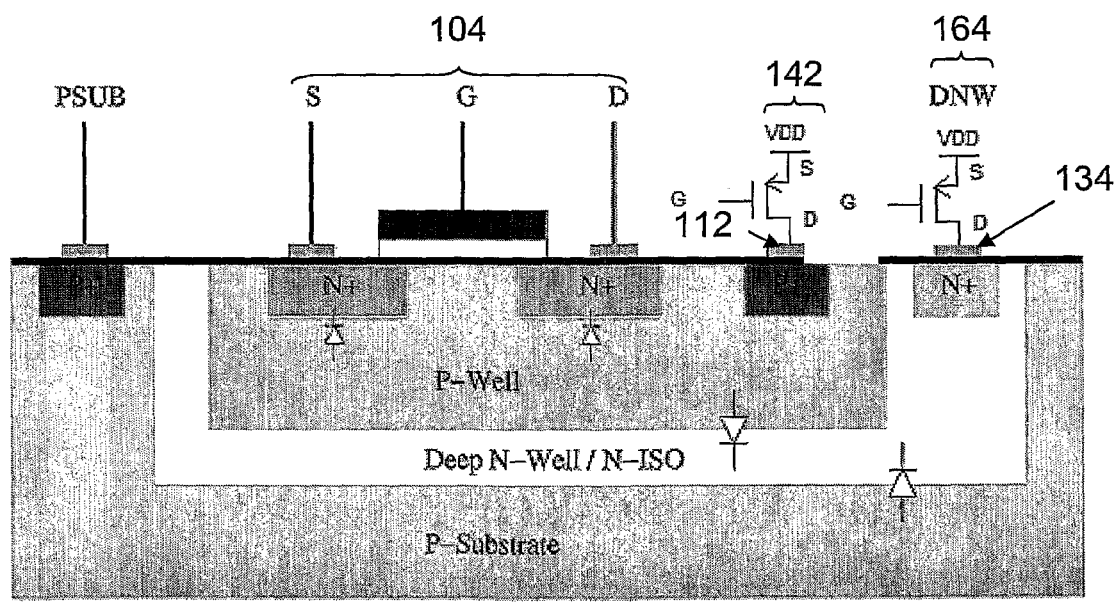
FIG. 5B shows a cross-sectional view of a transistor arrangement including an NMOS transistor in a triple-well structure with the body terminal being biased by a first PMOS transistor and the N-well terminal being biased by a second PMOS transistor according to an embodiment of the present invention.

FIG. 5B shows a cross-sectional view of a transistor arrangement including an NMOS transistor in a triple-well structure with the body terminal being biased by a first PMOS transistor and the N-well terminal being biased by a second PMOS transistor according to an embodiment of the present invention. FIG. 5B is similar to FIG. 5A with the difference such that the body terminal 112 of the NMOS transistor 104 and the N-well terminal 134 are respectively biased by PMOS transistors 142, 164 instead of NMOS transistors.

FIG. 6 shows a schematic of a conventional series-shunt type single-ended T/R switch arrangement. The T/R switch arrangement 166 includes two series 168 and two shunt 170 transistors. The series transistors 168, M1 and M2, perform the main switching functions for the transmit (TX) and receive (RX) paths and the shunt transistors 170, M3 and M4, increase the isolation of the switch. The shunt transistors 170, M3 and M4, are turned ON when the series transistors 168, M1 and M2 are turned OFF respectively, so that the undesired signal in each mode can be grounded by the shunt transistors 170. A shunt transistor may improve isolation but as a tradeoff, degradation on the insertion loss is observed, which may result from the parasitic capacitances of the shunt transistors in the cutoff region. Each of the shunt 170 or series 168 transistors includes a body terminal (not shown), a source terminal, a drain terminal and a gate terminal. The source terminal of the transistor M1 is connected to the transmitter (TX) and to the drain terminal of the transistor M3, the gate terminal is connected to one end of a gate bias resistor $R_{G1}$ and the drain terminal is connected to an antenna (ANT) and to the source terminal of the transistor M2. The gate terminal of the transistor M2 is connected to one end of another gate bias resistor $R_{G2}$ and the drain terminal is connected to the receiver (RX) and to the drain terminal of transistor M4. The gate terminal of transistor M3 is connected to one end of gate bias resistor $R_{G3}$ and the source terminal is connected to ground. The gate terminal of transistor M4 is connected to one end of gate bias resistor $R_{G4}$ and the source terminal is connected to ground. The other end of each of the respective gate bias resistors $R_{G1}$, $R_{G2}$, $R_{G3}$, $R_{G4}$ is connected to a power supply. The gate bias resistors may serve to improve dc-bias isolation.

FIG. 7 shows a model of parasitic capacitances of a MOS transistor that is used as a switch when the transistor is in the cut-off or subthreshold region where the transistor is turned OFF, and there is no conduction between drain and source. The OFF resistance between the drain and the source is very large and normally not considered. The parasitic capacitances couple part of the signal to ground and lead to insertion loss degradation. As the channel of the MOS transistor is not formed, gate-source capacitance ($C_{gs}$) and gate-drain capacitance ($C_{gd}$) are due only to overlap and fringing capacitances.

$$C_{gs}=C_{gd}WL_{ov}C_{ox} \quad (1)$$

where $L_{ov}$ denotes the overlap distance between gate and source/drain,
$C_{ox}$ denotes the gate capacitance per unit area,
W is the width of transistor.

The values of $C_{gs}$ and $C_{gd}$ may be very small when compared to that of a MOS transistor in saturation or triode region. The values of source-bulk capacitance ($C_{sb}$) and drain-bulk capacitance ($C_{db}$) may also be small when the channel is not present. The values of $C_{sb}$ and $C_{db}$ depend on the area of source and drain, respectively. For a stand-alone MOS transistor, drain-source capacitance ($C_{ds}$) may be very small and is normally not considered. However, when the transistor is used as a switch, the metal connection style exhibits severe coupling between drain and source, and thus $C_{ds}$ can not be ignored. This can be explained by a layout sketch of an interdigitized MOS transistor.

Figure 8:
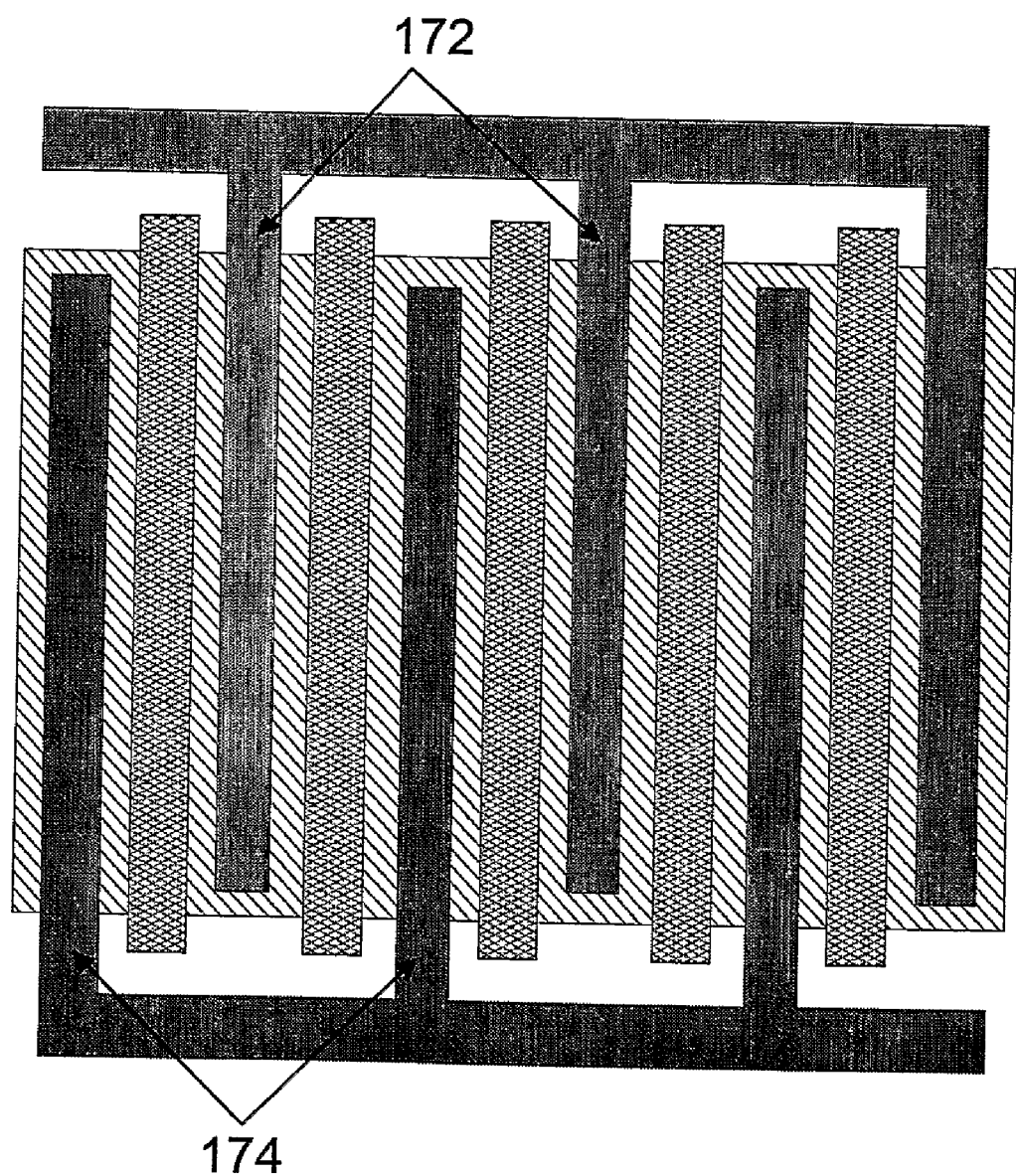
FIG. 8 shows a layout sketch of an interdigitized MOS transistor used as a switch.

FIG. 8 shows a layout sketch of an interdigitized MOS transistor used as a switch according to an embodiment of the present invention. The metal connections of the drain 172 and the source 174 are in parallel and next to each other. When these metals are connected as a switch, they actually form a lateral metal capacitor, which is of high capacity. The effect becomes more significant with the scale down of technologies, as the metal distance between drain 172 and source 174 decreases with smaller channel length.

FIG. 9A shows a foundry p-cell layout of an NMOS transistor operating as a switch according to an embodiment of the present invention. FIG. 9B shows a customized layout of an NMOS transistor operating as a switch according to an embodiment of the present invention. An NMOS transistor with the following dimensions: W=108 µm, L=0.13 µm, fingers=6. The drain-source distance of the customized layout of the NMOS transistor is approximately 4 times that of the p-cell layout. FIG. 9C shows a comparison table of parasitic capacitances of an NMOS transistor in cutoff region based on a foundry p-cell layout and a customized layout according to an embodiment of the present invention. The accurate values of these parasitic capacitances can be extracted from post layout simulations. When the transistor is OFF, the customized layout provides better isolation.

The overall drain-source coupling capacitance can be written as $$C_{OFF}=C_{ds}+(C_{gs} \cdot C_{gd}/C_{gs}+C_{gd}) \quad (2)$$

It is shown that $C_{OFF}$ is reduced significantly from 45.5-fF for the standard layout to 9.5-fF for the customized layout, which directly provides better isolation when the switch is used as the series transistor and is OFF. Furthermore, when this transistor is used as the shunt transistor, the smaller $C_{OFF}$ leads to smaller loss, which poses positive effect on the overall insertion loss.

Figure 10:
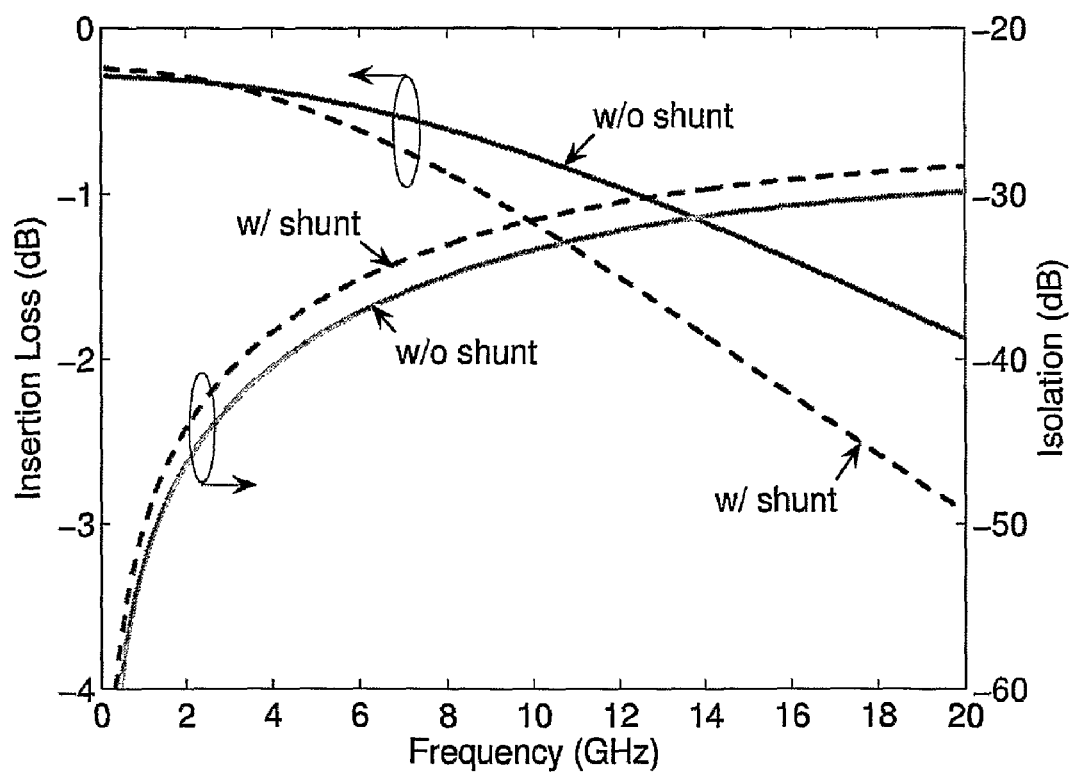
FIG. 10 shows a graph of simulated insertion loss and isolation of a T/R switch with and without shunt arms according to an embodiment of the present invention.

In the conventional series-shunt type single-ended T/R switch arrangement as shown in FIG. 6, the shunt transistors or shunt arm has to provide sufficient large impedance when it is turned OFF, so that insertion loss can be prevented from severe degradation. At high frequencies, the capacitive coupling effect becomes significant, leading to a shunt path with lower impedance and thus higher loss. At the same time, the presence of shunt arm degrades the power handling capability as the unintentional turn ON of the shunt transistor increases loss significantly. Thus, when the isolation can be maintained with customized layout strategy, the shunt arm becomes not necessary and can be removed to improve the insertion loss and linearity performances. FIG. 10 shows a graph of simulated insertion loss and isolation of a T/R switch with and without shunt arms according to an embodiment of the present invention. The results are obtained from post-layout simulations. For the switch with shunt arms, the sizes of series transistors and shunt transistors are W=108 µm/L=0.13 µm/6-fingers and W=21 µm/L=0.13 µm/3-fingers, respectively. For the switch without shunt arm, the sizes of series transistors are W=108 µm/L=0.13 µm/6-fingers, respectively. The layout employs standard p-cells and the customized layout as shown in FIG. 9B is employed. In the simulations, the signal is biased at 0.5-V and the high and low control voltages are 2-V and 0-V, respectively. It is shown that the customized switch layout achieves 2-dB better isolation when compared with standard transistor layout, and this result is obtained without shunt arms. Thus, the insertion loss and isolation tradeoffs due to shunt transistors are relaxed. Benefiting from the absence of shunt arms, significant improvement of insertion loss at high frequencies can be observed. The linearity performance is also improved without shunt arms. At 10-GHz, 19-dBm $P_{1dB}$ is obtained for the switch without shunt arms, while only 15-dBm $P_{1dB}$ is obtained for the switch with shunt arms.

Figure 11:
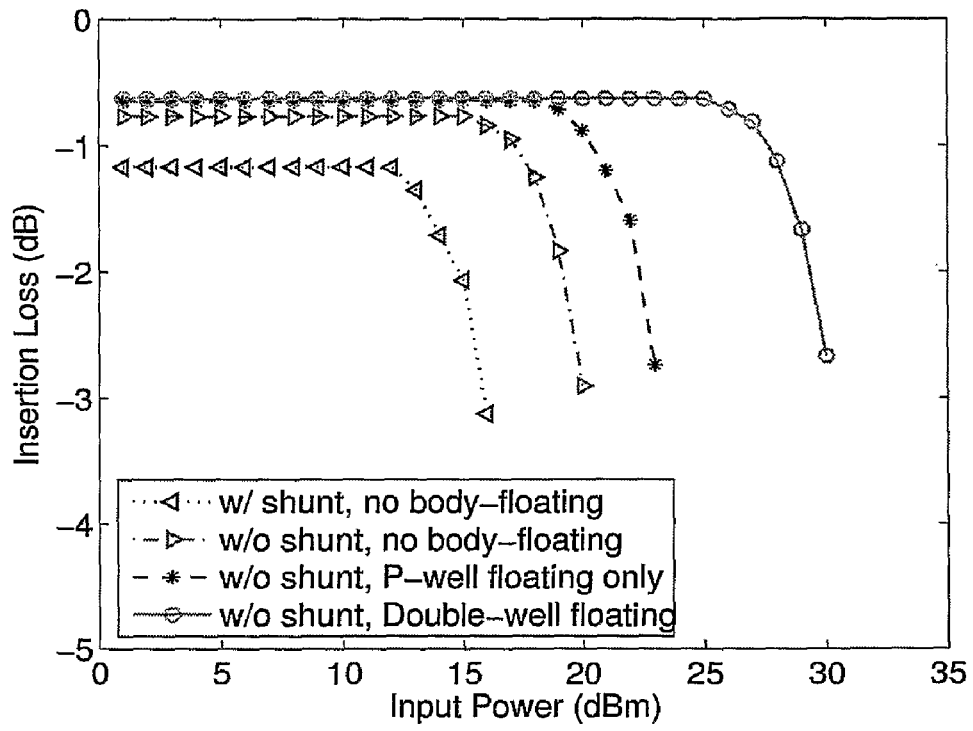
FIG. 11 shows a graph of simulated linearity of a T/R switch with and without shunt arms, and with different types of body-floating according to an embodiment of the present invention.

FIG. 11 shows a graph of simulated linearity of a T/R switch with and without shunt arms, and with different types of body-floating according to an embodiment of the present invention. As can be seen from FIG. 11, when input power increases, insertion loss drops due to linearity limitations (that is the switch cannot handle very large signals). When the insertion loss drops by 1-dB, the input power is noted as $P_{1dB}$, which is used to measure the linearity. There may also be other manners of measuring linearity in a T/R switch. The simulated linearity performance with different switch configurations is at 10-GHz. The different switch configurations are namely, switch with shunt arm and without body-floating, switch without shunt arm and without body floating, switch without shunt arm and with P-well floating only and switch without shunt arm and with double-well floating. As discussed earlier, the presence of shunt arms decreases the linearity, only 15-dBm $P_{1dB}$ is obtained for a switch with shunt arms and 19-dBm is obtained for that without shunt arms. Both results are simulated without body floating. With a P-well-only floating resistor of 5-kΩ, the $P_{1dB}$ is improved to 22-dBm. Dramatic improvement of linearity is observed when a second 5-kΩ resistor is used to further float the deep N-well. With resistor body-floating for both P-well and deep N-well, 29-dBm $P_{1dB}$ is obtained. These results exhibit the influence of junction diodes on the linearity performance and the efficiency of double-Well body-floating.

Figure 12:
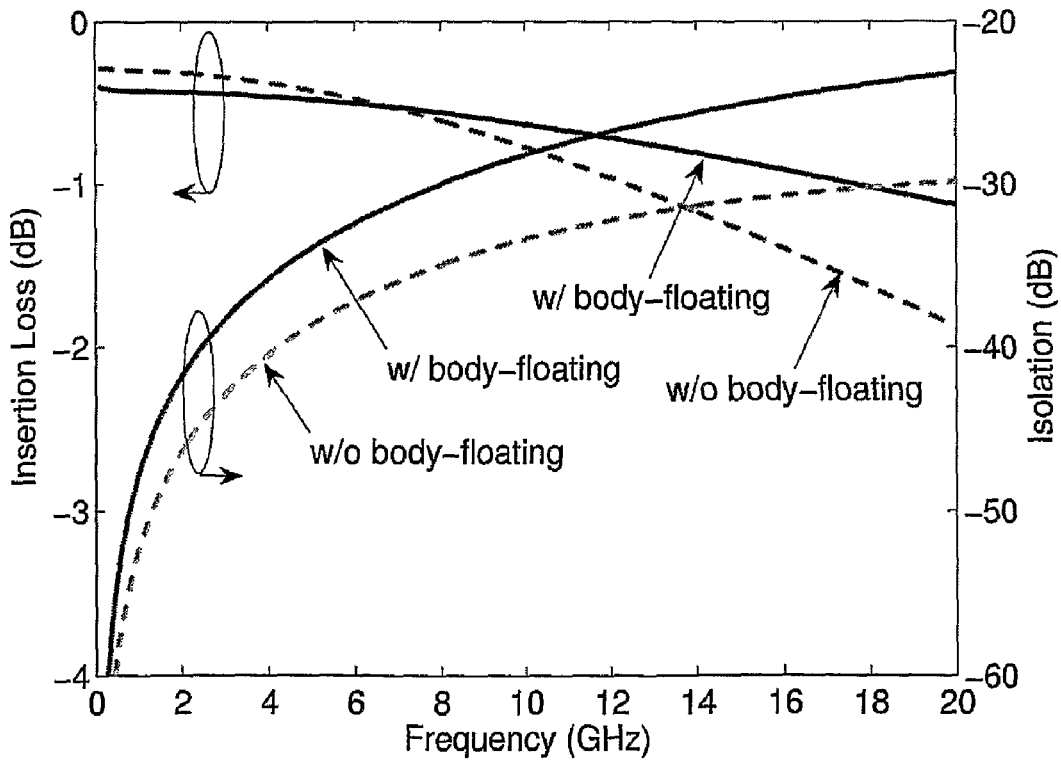
FIG. 12 shows a graph of simulated insertion loss and isolation of a T/R switch without shunt arms, and with and without body-floating according to an embodiment of the present invention.

Furthermore, the body-floating will certainly affect the insertion loss and isolation performances, especially when it is combined with the proposed custom layout scheme. For a switch transistor that is turned on, the parasitic capacitances regarding body, $C_{sb}$ and $C_{db}$, will no longer affect the insertion less as they are now floated. Thus, the negative effect of increased drain and source areas for a transistor which is in the ON state is eliminated. FIG. 12 shows a graph of simulated insertion loss and isolation of a T/R switch without shunt arms, and with and without body-floating according to an embodiment of the present invention. Note that double-well body-floating is used in the comparison; both circuits use the proposed custom layout and have no shunt transistors. It is clear that the insertion loss is improved with body-floating technique.

Figure 13:
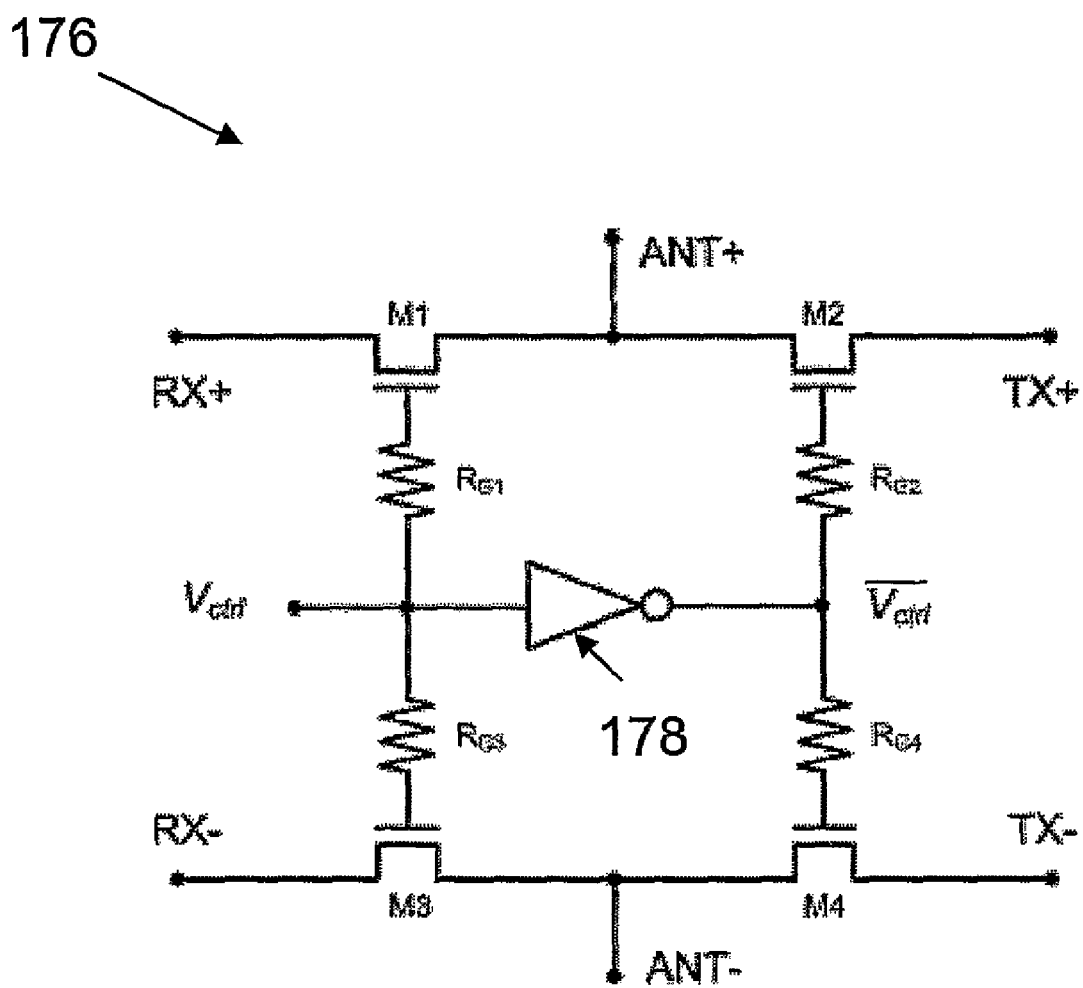
FIG. 13 shows a schematic of a differential T/R switch arrangement according to an embodiment of the present invention.

FIG. 13 shows a schematic of a differential T/R switch arrangement according to an embodiment of the present invention. The differential T/R switch arrangement 176 includes transistors M1, M2, M3 and M4, resistors $R_{G1}$, $R_{G2}$, $R_{G3}$, $R_{G4}$ and an inverter 178. Transistors M1, M2, M3, and M4 perform the main switching function. A high control voltage $V_{ctrl}$ turns M1 and M3 on, which enables the differential path between the antenna (ANT) and receiver (RX). Similarly, the differential transmit path is turned on when the control voltage is low. The control voltage is biased through the respective resistors $R_{G1}$, $R_{G2}$, $R_{G3}$, $R_{G4}$ to reduce the effect due to capacitive coupling around the gate of the OFF transistors. The differential nature results in an improved power handling capability comparing with single-ended configurations. From the power point of view, a differential output scheme is able to handle twice the single-ended output power, that is, 3-dB higher $P_{1dB}$ could be achieved in the proposed differential switch. As the power handling capability is the bottleneck of CMOS T/R switches, differential architecture is of great advantage in current silicon technology. Furthermore, comparing with single-ended architecture, the differential nature permits higher linearity, lower offset, makes it immune to power supply variations and substrate noise. Therefore, differential architecture is normally preferred in applications requiring higher signal quality. Exploring the design of integrated differential T/R switch is essential for transceiver front-ends with fully differential architecture. In the final circuit, only four switch transistors are employed, the transistor count in the proposed differential T/R switch arrangement 176 is exactly equal to that in single-ended switch as shown in FIG. 6 with shunt arms.

Experimental Results

Figure 14:
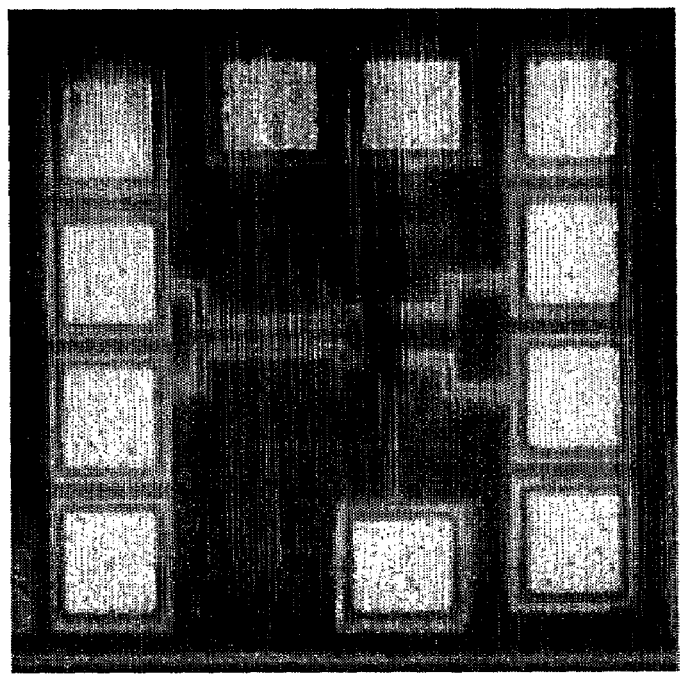
FIG. 14 shows a die photograph of fabricated differential T/R switch according to an embodiment of the present invention.

The efficiency of the invented method was checked and proved by experimental results of the fabricated IC chip. The final differential T/R switch circuit was fabricated in a 1.2-V two-poly eight-metal 0.13-µm triple-well CMOS technology. The cut off frequency $f_T$ of NMOS transistor is over 90-GHz. FIG. 14 shows a die photograph 180 of fabricated differential T/R switch according to an embodiment of the present invention. The active area of the switch is about 180 µm×50 µm.

Figure 15:
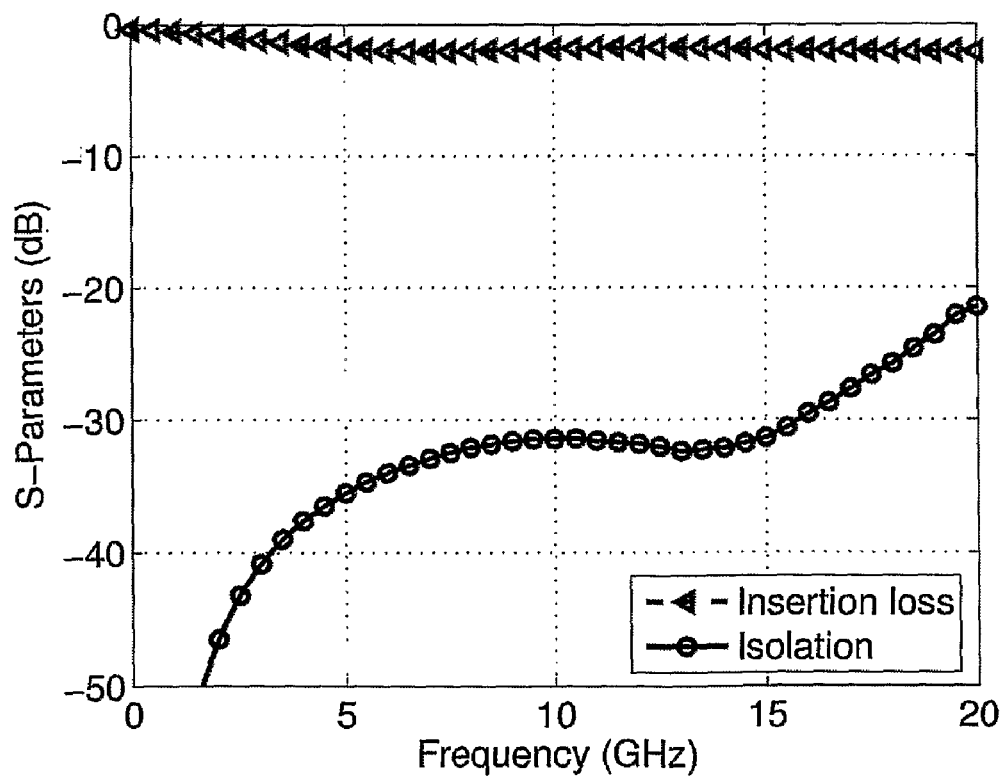
FIG. 15 shows a graph of measured insertion loss and isolation for differential-mode small-signals according to an embodiment of the present invention.

The measurements are carried out on a wafer, using Cascade Microtech's differential G-S-S-G probes. A four-port network analyzer was employed in the experiment, which avoids the complicated on-chip balun design for testability. The control voltage is 2/0-V and the TX/RX nodes are respectively biased at 0.5-V. FIG. 15 shows a graph of measured insertion loss and isolation for differential-mode small-signals according to an embodiment of the present invention. Assuming that the input and output is matched, the scattering-parameter (S-parameter) S21 is equivalent to the insertion loss (when switch is turned on) or isolation (when switch is turned off). The insertion loss is within 2.0-dB over DC to 20-GHz. At 0.9-, 5.8-, 10-, 15- and 20-GHz, the insertion loss is 0.7-, 1.5-, 1.7-, 1.7- and 2.0-dB, respectively. The isolation is below 21-dB at frequencies up to 20-GHz.

Figure 16:
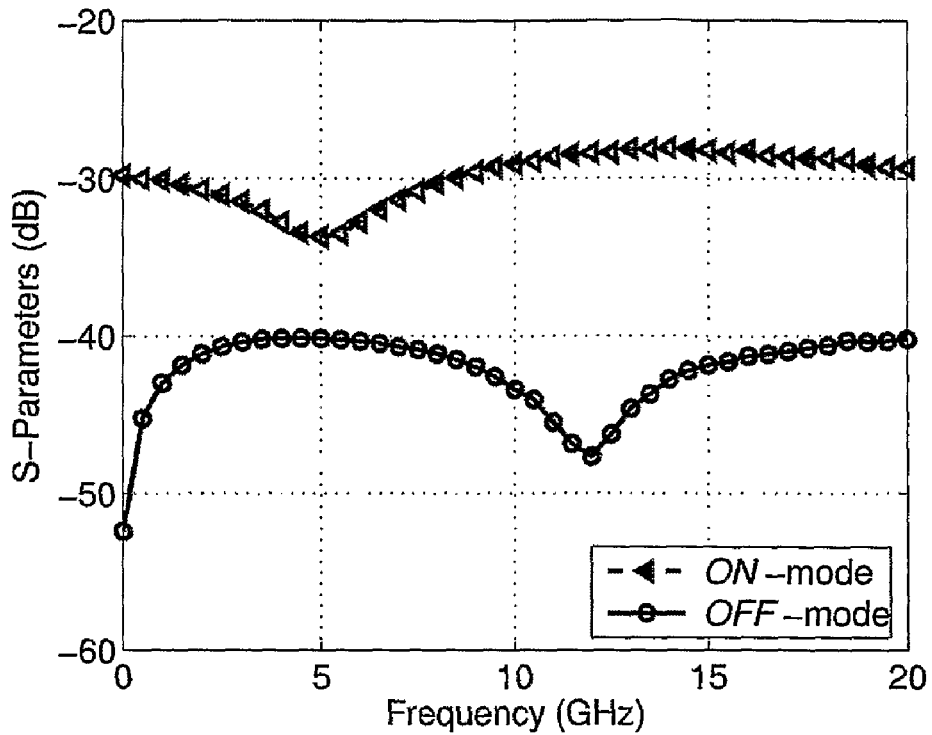
FIG. 16 shows a graph of measured common-mode rejection ratio in the ON and OFF mode of the differential T/R switch according to an embodiment of the present invention.

S-parameter is a measure of circuit or device characteristics. Depending on the configuration and application, the result may have different physical meaning, for example common-mode rejection ratio (CMRR), insertion loss, isolation. The CMRR is measured by the forward transmission coefficient from the transmitted common-mode signal to the received differential-mode signal. FIG. 16 shows a graph of measured common-mode rejection ratio in the ON and OFF mode of the differential T/R switch according to an embodiment of the present invention. In the ON mode, the common-mode rejection is better than 28.7-dB. In the OFF mode, it is better than 40-dB.

Figure 17:
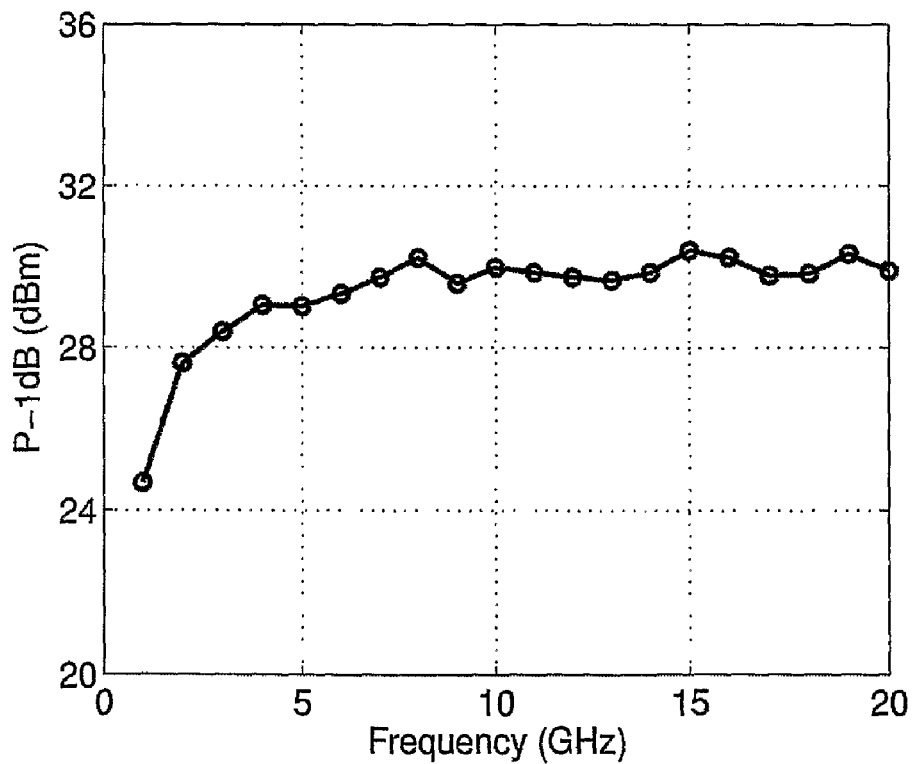
FIG. 17 shows a graph of power handling capability in terms of $P_{1dB}$ at different frequencies according to an embodiment of the present invention.

FIG. 17 shows a graph of power handling capability in terms of $P_{1dB}$ at different frequencies according to an embodiment of the present invention. The $P_{1dB}$ increases from about 24.6-dBm at about 1-GHz till about 30.2-dBm at about 8-GHz, and it remains at the level around 30-dBm at frequencies above 8-GHz. The power handling capability may improve significantly when comparing the double-well body floating technique with the single-well resistive body-floating.

The aforementioned description of the various embodiments has been presented for purposes of illustration and description. It is not intended to be exhaustive or to limit the invention to the precise form disclosed, and obviously many modifications and variations are possible in light of the disclosed teaching. It is intended that the scope of the invention be defined by the claims appended hereto.

What is claimed is:
1. A transistor arrangement comprising;
   a triple well structure, the triple well structure comprising
      a substrate of a first conductivity type;
      a first well region of a second conductivity type formed within the substrate; and
      a second well region of the first conductivity type separated from the substrate by the first well region;
   a first transistor formed on or in the second well region, the first transistor comprising a body terminal connected to the second well region;
   a second well region switch connected to the body terminal of the first transistor, wherein the body terminal of the first transistor is connected to a reference potential when the second well region switch is closed; and
   a controller connected to a control terminal of the second well region switch and controlling the second well region switch to be opened when the first transistor is in the ON state and to be closed when the first transistor is in the OFF state.

2. The transistor arrangement of claim 1, the substrate being a P-type substrate.

3. The transistor arrangement of claim 2, the first well region being an N-type well region.

4. The transistor arrangement of claim 3, the second well region being a P-type well region.

5. The transistor arrangement of claim 1, the first transistor further comprising a source terminal, a gate terminal and a drain terminal.

6. The transistor arrangement of claim 5, the source terminal comprising a source diffusion region of the second conductivity type being formed in the second well region;

the drain terminal comprising a drain diffusion region of the second conductivity type being formed in the second well region.

7. The transistor arrangement of claim 1, the body terminal comprising a body diffusion region of the first conductivity type being formed in the second well region.

8. The transistor arrangement of claim 1, the second well region switch being a second transistor.

9. The transistor arrangement of claim 8, the second transistor being a field-effect transistor or a bipolar transistor.

10. The transistor arrangement of claim 8, the second transistor being selected from a group of transistors consisting of metal-oxide-semiconductor field-effect transistor, n-channel metal-oxide-semiconductor field-effect transistor, p-channel metal-oxide-semiconductor field-effect transistor, junction gate field-effect transistor, insulated gate bipolar transistor.

11. The transistor arrangement of claim 1, further comprising a first well region terminal connected to the first well region.

12. The transistor arrangement of claim 11, the first well region terminal connected to the first well region comprising a diffusion region of the second conductivity type being formed in the first well region.

13. The transistor arrangement of claim 11, further comprising a passive component being coupled to the first well region terminal.

14. The transistor arrangement of claim 13, the passive component comprising a component selected from the group consisting of resistor, inductor and capacitor.

15. The transistor arrangement of claim 11, a first well region switch being coupled to the first well region terminal.

16. The transistor arrangement of claim 15, the first well region switch being a third transistor.

17. The transistor arrangement of claim 16, the third transistor being a field-effect transistor or a bipolar transistor.

18. The transistor arrangement of claim 16, the third transistor being selected from a group of transistors consisting of metal-oxide-semiconductor field-effect transistor, n-channel metal-oxide-semiconductor field-effect transistor, p-channel metal-oxide-semiconductor field-effect transistor, junction gate field-effect transistor, insulated gate bipolar transistor.

19. The transistor arrangement of claim 1, having a single-ended architecture.

20. The transistor arrangement of claim 1, having a differential architecture.

21. The transistor arrangement of claim 1, a fourth transistor having a source terminal, a gate terminal and a drain terminal.

22. The transistor arrangement of claim 21, the gate terminal of the first transistor and the gate terminal of the fourth transistor being arranged at a distance from one another of at least about twice the maximum process technology resolution.

\* \* \* \* \*